(12) United States Patent
Gu et al.

(10) Patent No.: US 9,978,676 B2
(45) Date of Patent: May 22, 2018

(54) SUB-TERAHERTZ/TERAHERTZ INTERCONNECT

(71) Applicant: The Regents of the University of California, Oakland, CA (US)

(72) Inventors: Qun Gu, Davis, CA (US); Xiaoguang Liu, Davis, CA (US); Neville C. Luhmann, Jr., Walnut Creek, CA (US); Bo Yu, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 42 days.

(21) Appl. No.: 15/167,796

(22) Filed: May 27, 2016

(65) Prior Publication Data
US 2016/0351489 A1     Dec. 1, 2016

Related U.S. Application Data

(60) Provisional application No. 62/167,559, filed on May 28, 2015.

(51) Int. Cl.
| H01P 1/02  | (2006.01) |
| H01L 23/50 | (2006.01) |
| H01P 5/08  | (2006.01) |
| H01L 23/52 | (2006.01) |
| H01L 23/66 | (2006.01) |
| H01P 5/107 | (2006.01) |

(52) U.S. Cl.
CPC .............. *H01L 23/50* (2013.01); *H01L 23/52* (2013.01); *H01L 23/66* (2013.01); *H01P 5/08* (2013.01)

(58) Field of Classification Search
CPC .... H01P 1/02; H01P 1/042; H01P 5/09; H01P 5/024; H01P 5/107
USPC ............................. 333/24 R, 157, 248, 254
See application file for complete search history.

(56) References Cited

U.S. PATENT DOCUMENTS

| 5,528,074 | A  | * | 6/1996 | Goto | H01L 23/66 257/664 |
| 7,680,464 | B2 | * | 3/2010 | Pleva | H01P 5/107 333/208 |
| 7,746,191 | B2 | * | 6/2010 | Tong | H01P 5/107 333/26 |
| 9,583,811 | B2 | * | 2/2017 | Seler | H01P 11/002 |
| 2012/0068890 | A1 | * | 3/2012 | Haroun | H01L 23/66 343/702 |
| 2013/0265732 | A1 | * | 10/2013 | Herbsommer | H05K 1/0243 361/774 |
| 2017/0207510 | A1 | * | 7/2017 | Park | H01P 3/165 |

* cited by examiner

*Primary Examiner* — Dean Takaoka
(74) *Attorney, Agent, or Firm* — Park, Vaughan, Fleming & Dowler LLP; Laxman Sahasrabuddhe

(57) ABSTRACT

An interconnect is described that comprises an interconnect channel, and two channel couplers coupled to the two ends of the interconnect channel through respective stoppers that provide a gap between the channel couplers and the interconnect channel. Each channel coupler can comprise a coplanar waveguide, a microstrip line, and a patch-antenna based coupler. The interconnect can enable communication between integrated circuits using signal waves having a frequency between 100 GHz and 3 THz.

20 Claims, 5 Drawing Sheets

SUB-TERAHERTZ/TERAHERTZ INTERCONNECT

RELATED APPLICATION

This application claims benefit of U.S. Provisional Application Ser. No. 62/167,559, by inventors Qun Gu, Xiaoguang Liu, and Neville C. Luhmann Jr., filed on 28 May 2015, having attorney docket number UC14-997-1PSP, the contents of which are herein incorporated by reference in their entirety for all purposes.

This invention was made with United States government support under Agreement Nos. NSF-ECCS-1348883 and NSF-ECCS-1351915 awarded by the National Science Foundation. The United States government has certain rights in the invention.

BACKGROUND

Technical Field

This disclosure relates to electronic circuits. More specifically, this disclosure relates to a sub-terahertz (THz)/THz interconnect.

Related Art

Semiconductor technology advancements generate two side effects. On the one hand, the advancements speed up data processing and reduce energy consumption per bit. On the other hand, these advancements keep increasing transmission data rate requirements and keep increasing the gap from interconnect capabilities. Some experts envision that the energy used for data communication is orders of magnitude higher than the energy used for data processing and storage (see e.g., E. Yablonovitch, SRC Workshop, Asheville, 2005). Therefore, in the near future, majority of the energy is expected to be consumed by data communication.

Intra-/inter- chip interconnects impose a wide range of stringent performance requirements: energy efficiency, bandwidth density, reliability, cost, etc. To meet these requirements, small size, low loss and low cost interconnect channels are crucial. Sub-THz/THz interconnect channels, due to small sizes, have been investigated based on a variety of materials and structures, with demonstrated losses of <1 dB/m. These low loss sub-THz/THz channels can potentially alleviate link budgets to boost interconnect efficiency. For example, see (1) J. W. Lamb, and W. A. Davis, "Miscellaneous data on materials for millimetre and submillimetre optics", International Journal of Infrared and Millimeter Waves, 17(12), 1997, (2) C. Yeh, F. Shimabukuro, and P. H. Siegel, "Low-loss terahertz ribbon waveguides", Appl. Opt., vol. 44, no. 28, October 2005, (3) B. Ung, A. Mazhorova, M. Roze, A. Dupuis, and M. Skorobogatiy, "Plastic fibers for terahertz wave guiding", ECOC Technical Digest, OSA, 2011, and (4) K. Wang, and D. M. Mittleman, "Metal wires for terahertz wave guiding", Nature, vol. 432, pp 376-379, November 2004.

SUMMARY

Some embodiments described herein feature an interconnect that comprises (1) an interconnect channel that can have a middle portion, a first end portion, and a second end portion, (2) a first channel coupler that can be coupled to the first end portion of the interconnect channel through a first stopper, wherein the first stopper can provide a first coupling gap between the first channel coupler and the first end portion of the interconnect channel, and (3) a second channel coupler that can be coupled to the second end portion of the interconnect channel through a second stopper, wherein the second stopper can provide a second coupling gap between the second channel coupler and the second end portion of the interconnect channel. The first end portion can include a first bend to guide signal waves between the middle portion and the first channel coupler, and the second end portion can include a second bend to guide signal waves between the middle portion and the second channel coupler.

In some embodiments, the first channel coupler can be electrically coupled to a transmitter and/or a receiver in a first integrated circuit (IC). Likewise, the second channel coupler can be electrically coupled to a transmitter and/or a receiver in a second IC. Additionally, in some embodiments, the interconnect, the first IC, and the second IC can be packaged in an IC package. Specifically, in some embodiments, the interconnect, the first IC, and the second IC can be fabricated using the same planar silicon process on a single die.

In some embodiments, each channel coupler can comprise (1) a coplanar waveguide, (2) a patch-antenna based coupler, and (3) a microstrip line. The microstrip line can be coupled between the coplanar waveguide and the patch-antenna based coupler, and the patch-antenna based coupler can be coupled to an end portion of the interconnect channel through a stopper. The coplanar waveguide can be coupled to a transmitter or a receiver in an IC.

A transmitter on a first IC can provide a communication signal having a frequency between 100 gigahertz (GHz) and 3 THz to the coplanar waveguide, which can provide the signal to the microstrip line. The microstrip line can provide the signal to the patch-antenna based coupler. From the patch-antenna based coupler, the signal can pass through the stopper and through the interconnect channel to the other end of the interconnect channel. At the other end, the interconnect channel can provide the signal to the patch-antenna based coupler, which can provide the signal to the microstrip line. Next, the microstrip line can provide the signal to coplanar waveguide, which can then provide the signal to a receiver on a second IC.

In some embodiments, the interconnect channel can be comprised of silicon with a relative permeability of approximately 11.9. Moreover, the silicon can have a resistivity greater than 5000 Ω-cm. In some embodiments, the bends in the first and second end portions of the interconnect channel can have a radius of curvature greater than 0.4 millimeters. In some embodiments, each stopper can be comprised of a dielectric material, such as SU-8.

DETAILED DESCRIPTION

Figure 1A:
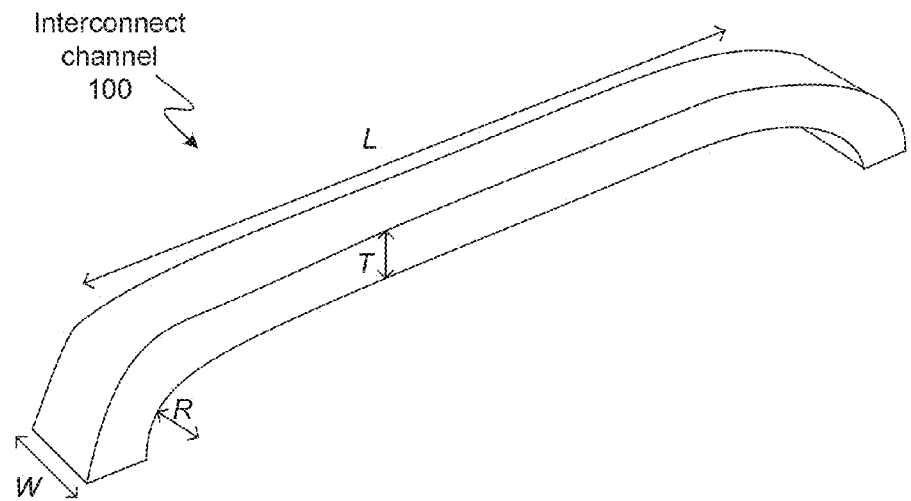
FIG. 1A illustrates an interconnect channel in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Some embodiments described herein feature sub-THz and/or THz interconnects that comprise channels and couplers that are compatible with a planar silicon process to realize high energy efficiency and high bandwidth density. Some embodiments include techniques to transmit multiple data streams through one physical channel by using different multiplexing schemes: including Time Division Multiplexing, Frequency Division Multiplexing, Wavelength Division Multiplexing, Mode Division Multiplexing, Polarization Division Multiplexing, etc.

The unique spectrum position of the sub-THz/THz interconnect (e.g., signal frequencies between 100 GHz to 3 THz), sitting between microwave and optical frequencies, allows the interconnect to leverage the advantages from both optic and electronic approaches. Low loss sub-THz/THz channels similar to optic fibers greatly relax interconnect link budget. Concurrently, a silicon based transceiver, scaling with technology, keeps interconnect bandwidth and efficiency improving at the same pace with device speed and maintains low manufacture cost and high reliability. Therefore, the THz interconnect aims to resolve the last centimeter issue for inter- and intra- chip links that have not been achieved by neither electronic nor optic interconnects.

Some advantages of embodiments described herein include, but are not limited to, (1) low cost due to the compatibility with existing mainstream semiconductor technologies with minimum fabrication changes, (2) high reliability due to the usage of mainstream semiconductor technologies, (3) high bandwidth and bandwidth density due to ultra high carrier frequency at sub-THz/THz and small channel size, (4) low loss due to dielectric waveguide material, and (5) scale friendly with semiconductor processes to match with technology advancement.

Interconnect Channel

The choice of channel material should consider several factors: 1) being compatible with silicon processing; 2) having large permittivity to concentrate the field along the channel for low loss and result in small channel size for large bandwidth density. Therefore, in some embodiments, high resistivity (HR) silicon dielectric, with relative permittivity around 11.9, is chosen as the channel material. The high resistivity (HR>5,000 Ω-cm) of the silicon dielectric reduces the propagation loss.

The advantages of dielectric waveguides over metallic waveguides include: (1) lower cutoff frequencies to allow further shrinking of the channel cross-section with less performance degradation for higher bandwidth density; (2) lower losses at high frequencies for better efficiency; (3) easier integration with silicon processes without significantly increasing fabrication complexity. Additionally, the large dielectric constant of silicon, around 11.9, facilitates to confine the field inside the channel to reduce propagation losses.

Figure 1B:
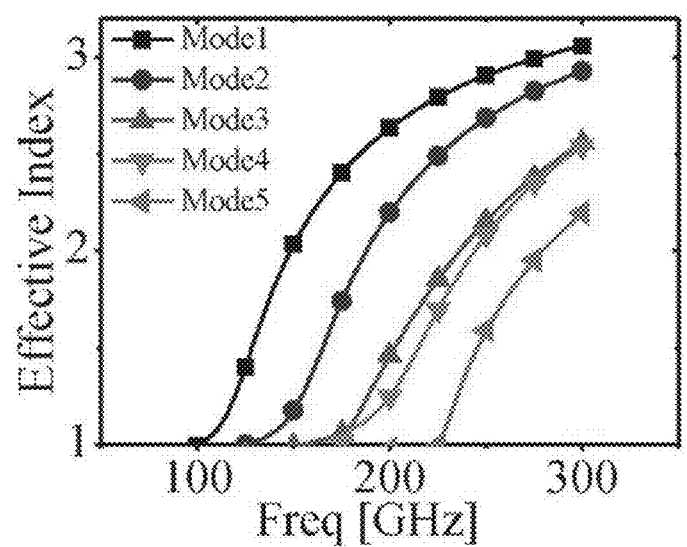
FIG. 1B presents a plot of the effective index versus propagation signal frequency for different modes of the interconnect channel illustrated in FIG. 1A in accordance with some embodiments described herein.
Figure 1C:
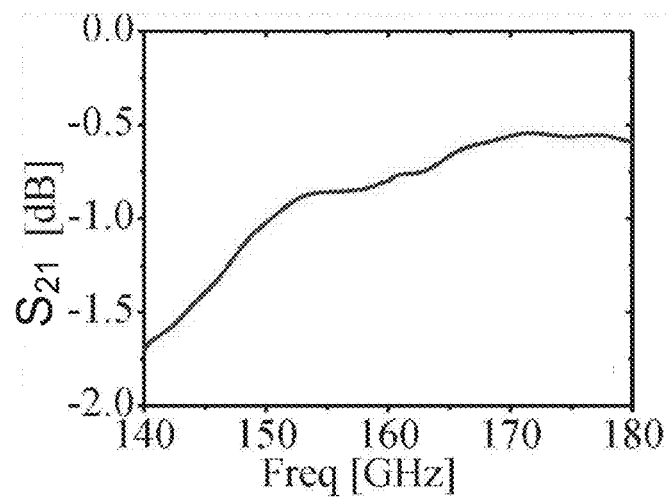
FIG. 1C presents a plot of the channel insertion loss for the interconnect channel illustrated in FIG. 1A in accordance with some embodiments described herein.

FIG. 1A illustrates an interconnect channel in accordance with some embodiments described herein. Interconnect channel 100 can be a silicon based dielectric channel, and can have width W and thickness T, and can comprises a middle portion having length L, and two end portions that have a bend with radius of curvature R to guide signal waves to and from planar ICs. FIG. 1B presents a plot of the effective index versus propagation signal frequency for different modes of the interconnect channel illustrated in FIG. 1A in accordance with some embodiments described herein. FIG. 1C presents a plot of the channel insertion loss for the interconnect channel illustrated in FIG. 1A in accordance with some embodiments described herein. The embodiment that was simulated in FIGS. 1B and 1C had the following dimensions: W=500 μm, T=400 μm, L=6 mm, and R=300 μm. FIG. 1B demonstrates the capability of the interconnect channel to support large bandwidth, and FIG. 1C demonstrates that the channel has a<1 dB insertion loss over a broad frequency band. In FIG. 1C, "$S_{21}$" represents the "S" parameter from "port 1" to "port 2," i.e., "$S_{21}$" represents the power transferred from "port 1" to "port 2." "Port 1" can correspond to one of the ends of interconnect channel 100, and "port 2" can correspond to the other end (interconnect channel 100 is symmetrical with respect to the two ends, so it doesn't matter which end is called "port 1" for computing the "$S_{21}$" parameter).

As explained above, to couple signals between two planar ICs, a bending structure is used. The bending structure has several tradeoffs. First, it is preferred that the bending radius be small to be compact and low profile so that the channels are reliable. On the other hand, when the radius is too small, the propagating waves tend to leak outside of the channel to cause large losses. To choose optimal radius, extensive simulation of the wave propagation based on different radius was performed. The simulation results show that the majority of the field is confined within the channel due to the large permittivity difference between silicon and the air. A simulation of the H-field distribution of a bending structure with the radius of 200 μm shows that some of field leaks out of the channel and increases the propagation loss. The $S_{21}$ and $S_{11}$ values were determined from simulation for radius values of 200, 300, and 400 μm. From the simulation results, it was found that $S_{11}$ values are less than −20 dB and $S_{21}$ values are less than −1 dB for all the three cases, with $S_{21}$ improving with a larger radius. Simulation results also indicated that further increasing of the radius higher than 400 μm results in incremental improvement in insertion loss, which indicates that wave leakage becomes less significant.

Channel Coupler

The channel coupler also needs to be compatible with planar silicon processes, with minimum changes of the fabrication procedure. In addition, the generated field should be convenient to couple to the channel with minimum coupling loss. Therefore, some embodiments described herein use a patch-antenna based coupler, which is completely compatible with silicon processes, and the perpendicular propagation pattern of the patch-antenna based coupler matches with channel feeding.

In some embodiments, a liquid crystalline polymer (e.g., Rogers 3850) with 1 mil thickness and dielectric constant of 2.9, can be used as the antenna substrate. The coupling structure consists of a coplanar waveguide (CPW), a via-less transition from the CPW to a microstrip line, the microstrip line, and the patch-antenna based channel coupler. All the metal, except the bottom copper-based ground, is for minimum oxidization. To simplify the coupler fabrication, a via-less CPW to microstrip line transition is adopted. Specifically, the bottom metal is ac-coupled through the thin substrate. Furthermore, by choosing ground plane width much smaller than the signal wavelength, higher order modes can be avoided to reduce insertion loss.

Figure 2A:
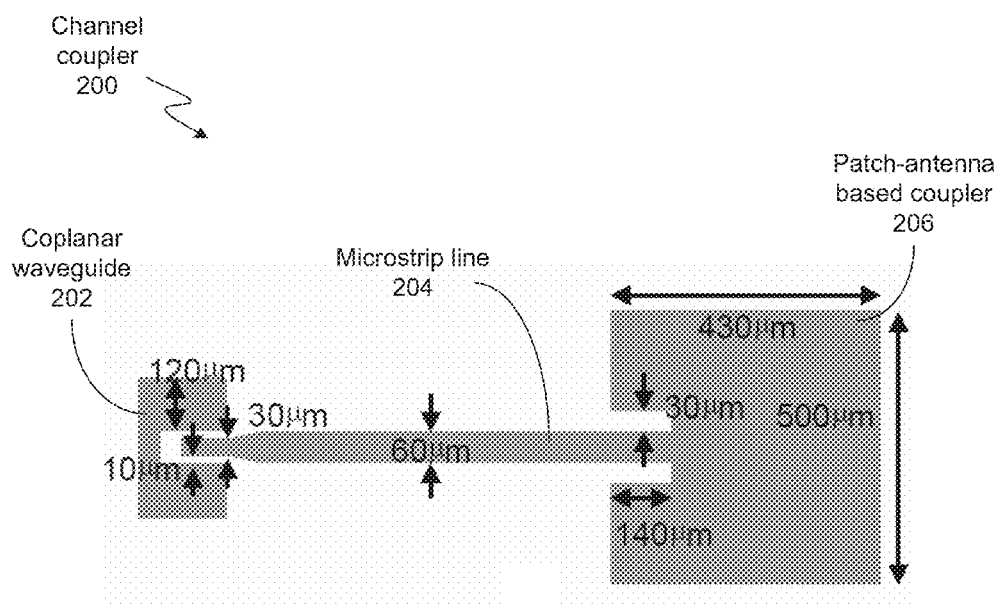
FIG. 2A illustrates a top view of a channel coupler in accordance with some embodiments described herein.
Figure 2B:
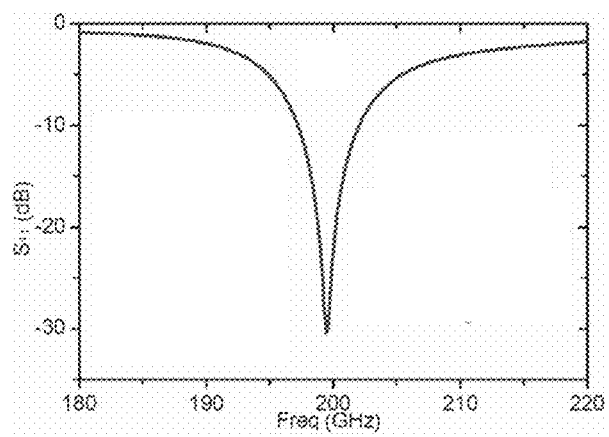
FIG. 2B presents a plot of the $S_{11}$ parameter (which represents the reflected power at port 1) for the channel coupler shown in FIG. 2A in accordance with some embodiments described herein.

FIG. 2A illustrates a top view of a channel coupler in accordance with some embodiments described herein. Channel coupler 200 includes coplanar waveguide 202, microstrip line 204, and patch-antenna based coupler 206. The dimensions shown in FIG. 2A are for illustration purposes only and are not intended to limit the scope of the instant application. FIG. 2B presents a plot of the $S_{11}$ parameter (which represents the reflected power at port 1) for the channel coupler shown in FIG. 2A in accordance with some embodiments described herein. As can be seen from the plot shown in FIG. 2B, a channel coupler that has the dimensions shown in FIG. 2A results in a −10 dB bandwidth of 4.8 GHz.

Interconnect Structure

To accurately control the coupling gap between the coupler and the channel, a stopper made of low loss dielectric material can be employed. For example, SU-8 can be used as the stopper material. With a dielectric constant of 2.9, the SU-8 stopper changes the coupler resonant frequency and the feeding impedance. The final coupler sizes (400 μm×500 μm) with SU-8 can therefore be adjusted by using electromagnetic simulation or measurement tools to resonate around 200 GHz.

Figure 3A:
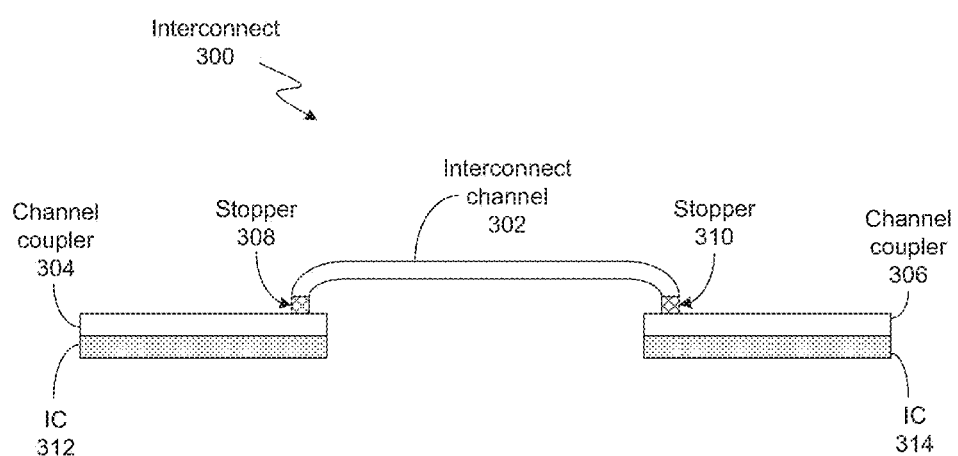
FIG. 3A illustrates a side view of an interconnect in accordance with some embodiments described herein.
Figure 3B:
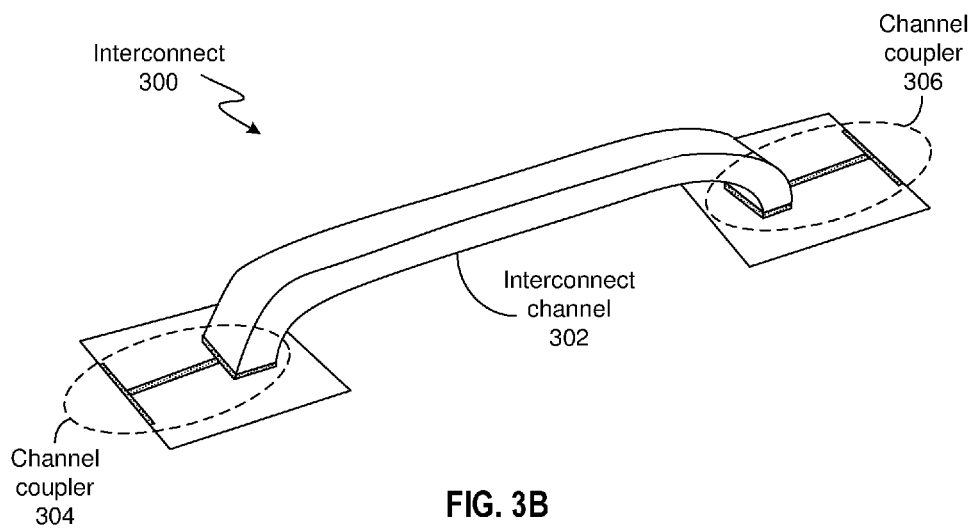
FIG. 3B illustrates a three dimensional view of an interconnect in accordance with some embodiments described herein.

FIG. 3A illustrates a side view of an interconnect in accordance with some embodiments described herein. FIG. 3A is for illustration purposes only (in particular, the components shown in FIG. 3A are not necessarily drawn to scale). Interconnect 300 includes interconnect channel 302 and channel couplers 304 and 306. Channel couplers 304 and 306 can be communicatively coupled to the two ends of interconnect channel 302 through stoppers 308 and 310, respectively. Channel couplers 304 and 306 can be electrically coupled to transmitters or receivers in ICs 312 and 314, respectively. FIG. 3B illustrates a three dimensional view of an interconnect in accordance with some embodiments described herein. In one embodiment, the total loss through the link path was approximately 5.1 dB at 200 GHz.

Fabrication Process

Figure 4:
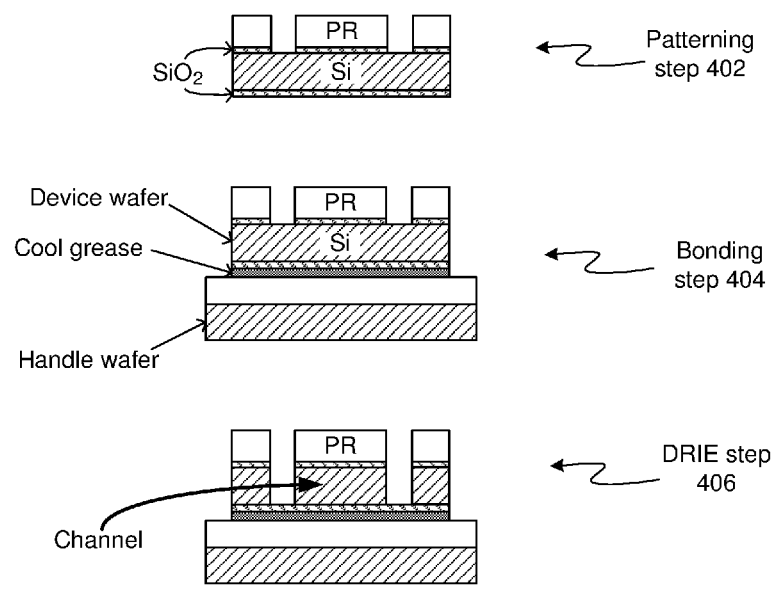
FIG. 4 illustrates a process for fabricating an interconnect channel in accordance with some embodiments described herein.

FIG. 4 illustrates a process for fabricating an interconnect channel in accordance with some embodiments described herein. The interconnect channel can be fabricated based on lithography and deep reactive ion etching (DRIE). First, a thick (~17 μm) photoresist (PR) can be patterned on the high resistance (HR) silicon wafer and hard-baked (patterning step 402). Using cool grease, the HR silicon wafer can be bonded on the top of a handle wafer (bonding step 404). The HR wafer can then be etched by DRIE process (DRIE step 406). After removing the cool grease, the individual channels can be separated.

Figure 5:
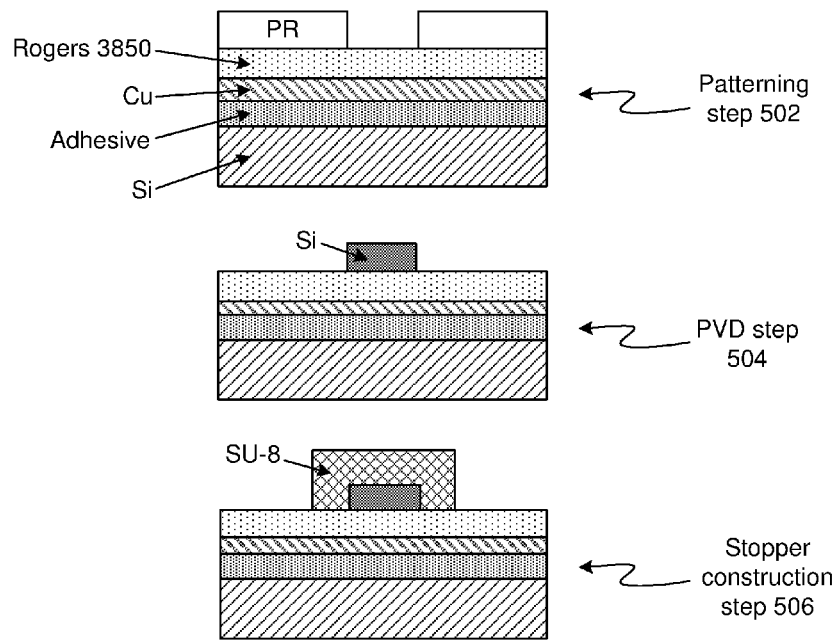
FIG. 5 illustrates a process for fabricating a patch-antenna based coupler in accordance with some embodiments described herein.

FIG. 5 illustrates a process for fabricating a patch-antenna based coupler in accordance with some embodiments described herein. Specifically, a patch-antenna based coupler can be fabricated using lithography and physical vapor deposition (PVD). In patterning step 502, an adhesive and a liquid crystalline polymer (e.g., "Rogers 3850" shown in FIG. 5) can be bonded on the top of a handle silicon wafer (shown as "Si" in FIG. 5). Then the top copper can be etched off. The antenna pattern can then be defined by a layer of photoresist (shown as "PR" in FIG. 5).

In PVD step 504, a layer of titanium (50 nm) and gold (300 nm) can be evaporated onto the substrate to form the top metal by a lift-off process (shown as "Au" in FIG. 5). Next, in stopper construction step 506, a 200-μm thick dielectric (e.g., SU8-2075) layer can be patterned to construct the dielectric stopper. To support the channel and facilitate assembly, a 3D printed holder with a low dielectric constant material (about 2.7) can be utilized, which has a negligible effect on the signal propagation based on full-wave simulation.

Figure 6:
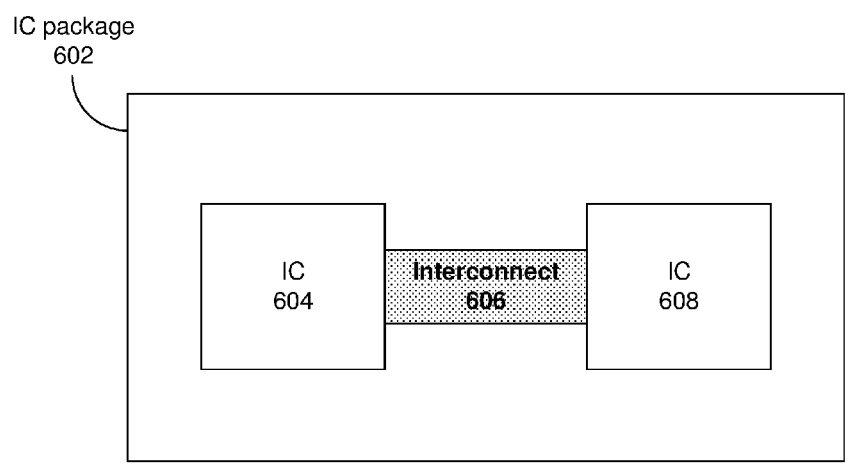
FIG. 6 illustrates an IC package in accordance with some embodiments described herein.

FIG. 6 illustrates an IC package in accordance with some embodiments described herein. Specifically, IC package 602 can include ICs 604 and 608 that can communicate with each other via interconnect 606. Specifically, ICs 604 and 608 can include transmitters and/or receivers that can send and/or receive sub-THz or THz communication signals (e.g., communication signals having a frequency between 100 GHz and 3 THz) through interconnect 606. As described in this disclosure, interconnect 606 can be fabricated using the same planar silicon process that is used for fabricating ICs 604 and 608. Specifically, in some embodiments, ICs 604 and 608 and interconnect 606 can be fabricated on the same die.

Sample Measurement Results

An interconnect was fabricated with channel length 6 mm, bend radius is 300 μm, and channel thickness 400 μm, and the measured S parameters were compared with the simulated results. Specifically, for the fabricated interconnect, the peak $S_{21}$ was −11.6 dB, which presents a 6.5 dB performance degradation compared to simulation results. The resonant frequency was shifted from 200 GHz to 190 GHz.

To verify performance sensitivity, the channel thickness was varied from 300 μm to 500 μm. The $S_{11}$ did not vary significantly for different thickness channels, which indicates that the frequency response is not determined by the channel, which is consistent with the simulation results. The magnitude of insertion loss $S_{21}$ varied with channel thickness. The larger the thickness, the lower the insertion loss tends to be. When the thickness is larger than 450 μm the magnitude of $S_{21}$ did not vary significantly.

The foregoing description has been presented to enable any person skilled in the art to make and use the embodiments. The described embodiments are not intended to be exhaustive or to limit the present invention. Various modifications to the disclosed embodiments will be readily apparent to those skilled in the art, and the general principles defined herein are applicable to other embodiments and applications without departing from the spirit and scope of the present disclosure. Thus, the present invention is to be accorded the widest scope consistent with the principles and features disclosed herein. The scope of the present invention is defined by the appended claims.

What is claimed is:

1. An interconnect, comprising:
   an interconnect channel having a middle portion, a first end portion, and a second end portion;

a first channel coupler coupled to the first end portion of the interconnect channel through a first stopper, wherein the first stopper provides a first coupling gap between the first channel coupler and the first end portion of the interconnect channel;

a second channel coupler coupled to the second end portion of the interconnect channel through a second stopper, wherein the second stopper provides a second coupling gap between the second channel coupler and the second end portion of the interconnect channel;

wherein the first end portion includes a first bend to guide signal waves between the middle portion and the first channel coupler;

wherein the second end portion includes a second bend to guide signal waves between the middle portion and the second channel coupler;

wherein the first channel coupler comprises a first coplanar waveguide, a first patch-antenna based coupler, and a first microstrip line, wherein the first microstrip line is coupled between the first coplanar waveguide and the first patch-antenna based coupler, and wherein the first patch-antenna based coupler is coupled to the first end portion of the interconnect channel through the first stopper; and wherein the second channel coupler comprises a second coplanar waveguide, a second patch-antenna based coupler, and a second microstrip line, wherein the second microstrip line is coupled between the second coplanar waveguide and the second patch-antenna based coupler, and wherein the second patch-antenna based coupler is coupled to the second end portion of the interconnect channel through the second stopper.

2. The interconnect of claim 1, wherein the first coplanar waveguide is coupled to a first transmitter and/or a first receiver in a first integrated circuit (IC), and wherein the second coplanar waveguide is coupled to a second transmitter and/or a second receiver in a second IC.

3. The interconnect of claim 2, wherein the interconnect, the first IC, and the second IC are fabricated on a single die using a planar silicon process.

4. The interconnect of claim 1, wherein the interconnect channel is comprised of silicon with a relative permeability of approximately 11.9.

5. The interconnect of claim 4, wherein the silicon has a resistivity greater than 5000Ω-cm.

6. The interconnect of claim 1, wherein each of the first bend and the second bend has a radius of curvature greater than 0.4 millimeters.

7. The interconnect of claim 1, wherein each stopper is comprised of SU-8.

8. The interconnect of claim 1, wherein the signal waves have a frequency between 100 GHz and 3 THz.

9. An interconnect, comprising:
an interconnect channel having a middle portion, a first end portion, and a second end portion, wherein the interconnect channel is comprised of silicon with a relative permeability of approximately 11.9;
a first channel coupler coupled to the first end portion of the interconnect channel through a first stopper, wherein the first stopper provides a first coupling gap between the first channel coupler and the first end portion of the interconnect channel;
a second channel coupler coupled to the second end portion of the interconnect channel through a second stopper, wherein the second stopper provides a second coupling gap between the second channel coupler and the second end portion of the interconnect channel;

wherein the first end portion includes a first bend to guide signal waves between the middle portion and the first channel coupler; and wherein the second end portion includes a second bend to guide signal waves between the middle portion and the second channel coupler.

10. The interconnect of claim 9, wherein each stopper is comprised of SU-8.

11. The interconnect of claim 10, wherein the first coplanar waveguide is coupled to a first transmitter and/or a first receiver in a first integrated circuit (IC), and wherein the second coplanar waveguide is coupled to a second transmitter and/or a second receiver in a second IC.

12. The interconnect of claim 11, wherein the interconnect, the first IC, and the second IC are fabricated on a single die using a planar silicon process.

13. The interconnect of claim 9, wherein the silicon has a resistivity greater than 5000Ω-cm.

14. The interconnect of claim 9, wherein each of the first bend and the second bend has a radius of curvature greater than 0.4 millimeters.

15. An interconnect, comprising:
an interconnect channel having a middle portion, a first end portion, and a second end portion;
a first channel coupler coupled to the first end portion of the interconnect channel through a first stopper, wherein the first stopper provides a first coupling gap between the first channel coupler and the first end portion of the interconnect channel;
a second channel coupler coupled to the second end portion of the interconnect channel through a second stopper, wherein the second stopper provides a second coupling gap between the second channel coupler and the second end portion of the interconnect channel;
wherein each stopper is comprised of SU-8;
wherein the first end portion includes a first bend to guide signal waves between the middle portion and the first channel coupler; and
wherein the second end portion includes a second bend to guide signal waves between the middle portion and the second channel coupler.

16. The interconnect of claim 15, wherein the signal waves have a frequency between 100 GHz and 3 THz.

17. The interconnect of claim 16, wherein the first coplanar waveguide is coupled to a first transmitter and/or a first receiver in a first integrated circuit (IC), and wherein the second coplanar waveguide is coupled to a second transmitter and/or a second receiver in a second IC.

18. The interconnect of claim 17, wherein the interconnect, the first IC, and the second IC are fabricated on a single die using a planar silicon process.

19. The interconnect of claim 15, wherein the interconnect channel is comprised of silicon with a relative permeability of approximately 11.9, and wherein the silicon has a resistivity greater than 5000Ω-cm.

20. The interconnect of claim 15, wherein each of the first bend and the second bend has a radius of curvature greater than 0.4 millimeters.

* * * * *